United States Patent
Ando

(10) Patent No.: US 12,547,070 B2
(45) Date of Patent: Feb. 10, 2026

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventor: Toshiaki Ando, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/734,037

(22) Filed: Jun. 5, 2024

(65) Prior Publication Data

US 2024/0319589 A1   Sep. 26, 2024

Related U.S. Application Data

(62) Division of application No. 17/201,025, filed on Mar. 15, 2021, now Pat. No. 12,032,282.

(30) Foreign Application Priority Data

Apr. 6, 2020 (JP) .................................. 2020-068331

(51) Int. Cl.
*G03F 7/00* (2006.01)
(52) U.S. Cl.
CPC ................................. *G03F 7/0002* (2013.01)
(58) Field of Classification Search
CPC .................................................... G03F 7/0002
See application file for complete search history.

(56) References Cited

U.S. PATENT DOCUMENTS

| 2006/0272535 | A1* | 12/2006 | Seki ...................... B29C 43/021 |
| | | | 101/492 |
| 2008/0099941 | A1 | 5/2008 | Suehira et al. |
| 2010/0085555 | A1 | 4/2010 | Schmid et al. |
| 2013/0078820 | A1 | 3/2013 | Mikami |
| 2013/0078821 | A1 | 3/2013 | Furutono |

(Continued)

FOREIGN PATENT DOCUMENTS

| JP | 2005078723 A | 3/2005 |
| JP | 2011240662 A | 12/2011 |

(Continued)

OTHER PUBLICATIONS

English translation of JP2019036572 (Year: 2019).*

(Continued)

*Primary Examiner* — Xiao S Zhao
*Assistant Examiner* — Victoria Bartlett
(74) *Attorney, Agent, or Firm* — ROSSI, KIMMS & McDOWELL LLP

(57) ABSTRACT

An imprint apparatus in which contamination in an apparatus due to an uncured material or the like can be minimized is provided. The imprint apparatus includes: a first irradiation unit configured to irradiate an imprint material on a substrate with light for performing curing in a state in which the imprint material is brought into contact with a pattern portion having a concave and convex pattern formed in a mold; and a second irradiation unit configured to irradiate a peripheral region of the pattern portion of the mold after the irradiation of the light using the first irradiation unit.

9 Claims, 8 Drawing Sheets

(56) References Cited

U.S. PATENT DOCUMENTS

| | | |
|---|---|---|
| 2017/0075229 A1 | 3/2017 | Yamada |
| 2018/0243970 A1 | 8/2018 | Kokubo |
| 2018/0275510 A1 | 9/2018 | Kawamura |
| 2019/0079391 A1 | 3/2019 | Fukuhara et al. |
| 2020/0026183 A1 | 1/2020 | Fletcher |
| 2021/0005446 A1 | 1/2021 | Fletcher et al. |
| 2021/0397083 A1 | 12/2021 | Ter Meulen et al. |

FOREIGN PATENT DOCUMENTS

| | | | |
|---|---|---|---|
| JP | 2015035509 A | | 2/2015 |
| JP | 2016131257 A | | 7/2016 |
| JP | 2018163946 A | | 10/2018 |
| JP | 2019036572 A | * | 3/2019 |
| JP | 2019075551 A | | 5/2019 |
| KR | 1020190013525 A | | 2/2019 |
| KR | 1020190031862 A | | 3/2019 |
| KR | 1020190069306 A | | 6/2019 |

OTHER PUBLICATIONS

Office Action issued in U.S. Appl. No. 17/201,025, mailed on Oct. 28, 2022.
Office Action issued in U.S. Appl. No. 17/201,025, mailed on Apr. 11, 2023.
Office Action issued in U.S. Appl. No. 17/201,025, mailed on Oct. 4, 2023.
Notice of Allowance issued in U.S. Appl. No. 17/201,025, mailed on Mar. 20, 2024.
Office Action issued in Korean Patent Application No. 10-2021-0039293 mailed Aug. 9, 2024. English translation provided.
Office Action issued in Korean Appln. No. 10-2021-0039293 mailed May 23, 2025.

* cited by examiner (A)

(B)

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method, and an article manufacturing method.

Description of the Related Art

With the increasing demand for smaller sizes of semiconductor devices, MEMSs, and the like, in addition to conventional photolithography techniques, a microproduction technique in which a photocurable material (an imprint material or a resin) on a substrate is formed using a mold (a mould) and a composition of the photocurable material is formed above the substrate is attracting attention. This technique which is also called an imprinting technique can form a fine structure body on the order of several nanometers on the substrate.

For example, one imprinting technique is a photocuring method. An imprint method in which this photocuring method is adopted is a method in which a uniform-sized pattern is transferred to a substrate by applying an uncured photocurable material above the substrate and pressing (imprinting or pressurizing) a mold having a nanometer-order structure (a circuit pattern) against this substrate and then curing the photocurable material and releasing the mold from the substrate after the photocurable material has cured. However, in this imprint method, when the mold is imprinted on the substrate, the mold comes into contact with the photocurable material and the photocurable material may protrude from mesa portions formed on the mold. When the protruding photocurable material is in an uncured state, the uncured material may fall into a processing apparatus and serve as a source of contamination.

In response to this problem, Japanese Patent Laid-Open No. 2018-163946 includes a mechanism for removing a photocurable material which is disposed above a substrate holder using an exhaust and air supply mechanism to prevent the uncured material protruding from mesa portions of a mold. Furthermore, Japanese Patent Laid-Open No. 2016-131257 includes a concave portion which is configured to receive and collect the excess uncured material generated at the time of imprinting and which is disposed in a mold.

However, in the methods of Japanese Patent Laid-Open No. 2018-163946 and Japanese Patent Laid-Open No. 2016-131257, uncured material may remain on the mold and contaminate an apparatus due to volatile components, foreign matter, or the like of the uncured material in some cases.

SUMMARY OF THE INVENTION

An object of the present invention is to provide an imprint apparatus in which contamination in the apparatus due to, for example, uncured material or the like can be minimized.

The present invention includes: a first irradiation unit configured to irradiate an imprint material on a substrate with light for performing curing in a state in which the imprint material is brought into contact with a pattern portion having a concave and convex pattern formed in a mold; and a second irradiation unit configured to irradiate a peripheral region of the pattern portion of the mold with light after the irradiation of the light using the first irradiation unit.

Further features of the present invention will become apparent from the following description of exemplary embodiments with reference to the attached drawings.

DESCRIPTION OF THE EMBODIMENTS

Figure 1:
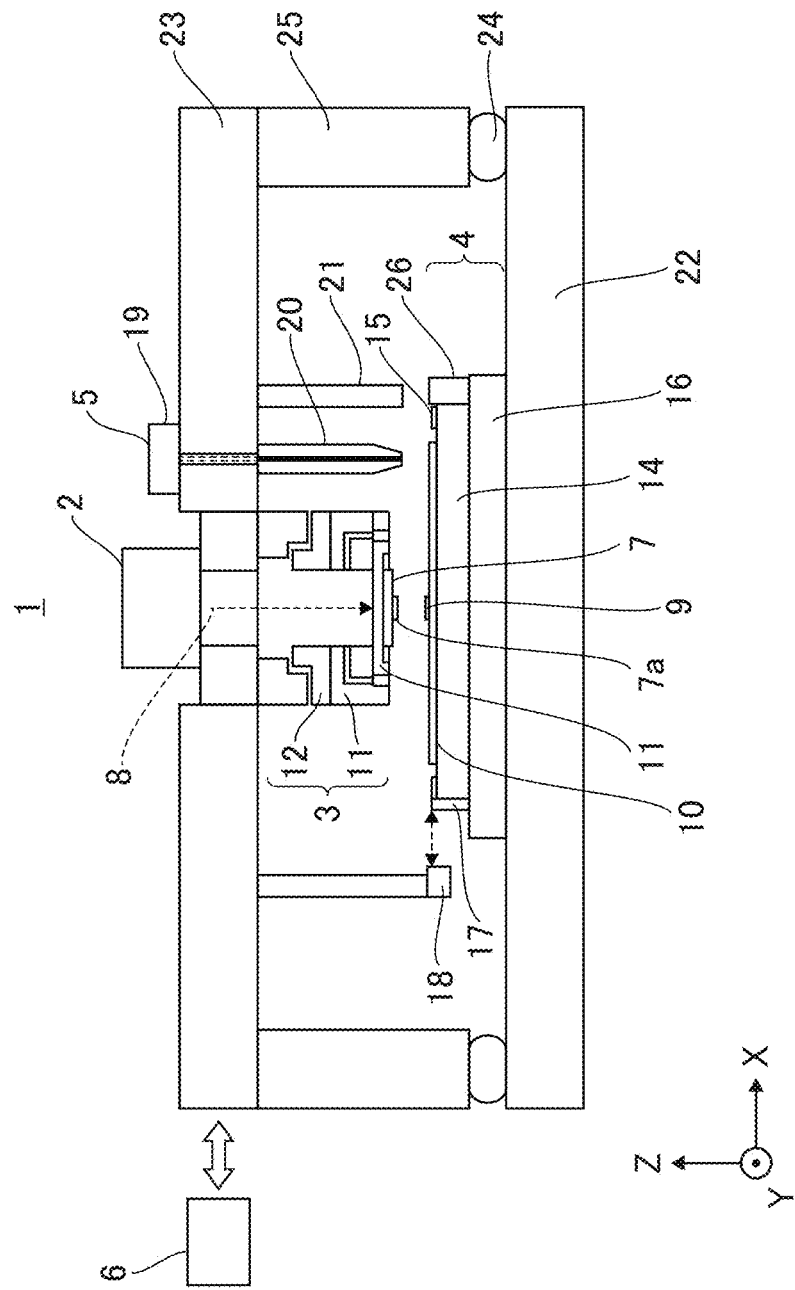
FIG. 1 is a diagram illustrating a schematic configuration of an imprint apparatus according to a first embodiment.

Preferred embodiments of the present invention will be described below with reference to the accompanying drawings using examples. In the drawings, the same constituent members or elements will be denoted by the same reference numerals and duplicate description thereof will be omitted or simplified.

First Embodiment

FIG. 1 is a diagram illustrating an example of a configuration of an imprint apparatus (a lithography apparatus) 1. The imprint apparatus 1 in the first embodiment is an apparatus in which, as illustrated in FIG. 1, first, an imprint material 9 (a resin or a composition) supplied above a substrate 10 is brought into contact with a mold (an original plate or a mould) 7, and when energy for curing is applied to the imprint material 9, a pattern of a cured product having a concave and convex pattern of the mold 7 transferred thereto is formed and a pattern (a concave and convex pattern) of the imprint material 9 is formed above the substrate 10. The imprint apparatus 1 is used for manufacturing a device such as a semiconductor device. Furthermore, it is assumed that a direction parallel to an optical axis of an irradiation optical system which will be described later and which irradiates (illuminates) the imprint material 9 above the substrate 10 with irradiation light 8 is a Z-axis direction and two directions orthogonal to each other in a plane perpendicular to the Z-axis direction are an X-axis direction and a Y-axis direction.

Each part of the imprint apparatus 1 in the first embodiment will be described below with reference to FIG. 1. The imprint apparatus 1 may include an irradiation unit 2, a mold holding unit 3, a substrate stage 4, a coating unit 5, a controller 6, a mold chuck 11, a mold moving mechanism 12, a substrate chuck 14, a stage driving mechanism 16, and an alignment measurement unit 21. Furthermore, the imprint apparatus 1 may include a surface plate 22 having the substrate stage 4 placed thereon and configured to form a reference plane, a bridge surface plate 23 having the mold holding unit 3 fixed thereto, and a column 25 extending from the surface plate 22 and configured to support the bridge surface plate 23 via a vibration isolator 24 configured to remove vibrations from a floor surface. In addition, although not illustrated in the drawings, the imprint apparatus 1 may include a mold transfer portion configured to load and unload the mold 7 between the outside of the apparatus and the mold holding unit 3, a substrate transfer portion configured to load and unload the substrate 10 between the outside of the apparatus and the substrate stage 4, and the like.

An irradiation unit (a first irradiation unit) 2 has a light source (not shown) and the irradiation optical system and the irradiation optical system may include, for example, a combination of optical elements which will be described later. In imprint processing (molding processing), the irradiation unit 2 irradiates the imprint material 9 above the substrate 10 with the irradiation light 8 via the mold 7. The irradiation unit 2 may include the light source and optical elements (a lens, a mirror, a light shielding plate, and the like) configured to adjust the irradiation light 8 from the light source to a state of the irradiation light 8 appropriate for imprint processing, for example, a light intensity distribution, an illumination region, and the like. In the first embodiment, the photocuring method is adopted. Thus, although the imprint apparatus 1 has the irradiation unit 2, the present invention is not limited thereto. The imprint apparatus 1 may not include the irradiation unit 2 and the irradiation unit 2 may be installed outside the imprint apparatus 1.

The mold holding unit (a holder) 3 may include the mold chuck 11 configured to attract and hold the mold 7 through a vacuum suction force or an electrostatic force and a mold moving mechanism (a mold moving portion) 12 configured to move the mold 7 or the mold chuck 11. The mold chuck 11 and the mold moving mechanism 12 have an opening in a central portion (inside) so that the imprint material 9 above the substrate 10 is irradiated with the irradiation light 8 from the irradiation unit 2. The mold moving mechanism 12 causes the mold 7 to move in the Z-axis direction (an upward/downward direction) so that the mold 7 is pressed (imprinted) on the imprint material 9 above the substrate 10 or the mold 7 is separated (released) from the imprint material 9 above the substrate 10. Actuators applicable to the mold moving mechanism 12 include, for example, linear motors, servomotors, or air cylinders. The mold moving mechanism 12 may be constituted of a plurality of drive systems such as a coarse movement drive system and a fine movement drive system to position the mold 7 with high accuracy. Furthermore, the mold moving mechanism 12 may be configured to be able to move the mold 7 not only in the Z-axis direction but also in the X-axis direction and the Y-axis direction. In addition, the mold moving mechanism 12 may be configured to have a tilt function for adjusting a position of the mold 7 in an θ (rotation around a Z axis) direction and the inclination of the mold 7.

The substrate stage (a substrate moving portion) 4 may include a substrate chuck (a substrate holder) 14 configured to attract and hold the substrate 10 through a vacuum suction force or an electrostatic force and the stage driving mechanism 16 configured to move the substrate stage 4. The substrate chuck 14 is installed above the stage driving mechanism 16. Furthermore, an auxiliary member 15 is disposed around the substrate chuck 14 to surround the substrate 10 held by the substrate chuck 14. In addition, the auxiliary member 15 is disposed so that an upper surface of the auxiliary member 15 and an upper surface of the substrate 10 held by the substrate chuck 14 are at substantially the same height. Moreover, the auxiliary member 15 has a function of preventing a first gas 30 (not shown) which will be described later from entering optical paths between reference mirrors 17 and laser interferometers 18. Due to the presence of the auxiliary member 15, when a pattern forming region (a shot region or a molding region) arranged around the substrate 10 is imprinted, there is also an effect that a concentration of a gas supplied from a first gas supply unit (not shown) can be kept high. There may be a difference between a height of the upper surface of the auxiliary member 15 and a height of the upper surface of the substrate 10 held by the substrate chuck 14, as long as a concentration of a gas does not differ by 1% or more between a space above the auxiliary member 15 and a space above the substrate 10. For example, the difference between the heights of the upper surface of the auxiliary member 15 and the upper surface of the substrate 10 held by the substrate chuck 14 may be 1 mm or less. More preferably, the difference between the heights of the upper surface of the auxiliary member 15 and the upper surface of the substrate 10 held by the substrate chuck 14 is 0.1 mm or less.

The substrate stage 4 can be moved in the X-axis and Y-axis directions by driving the stage driving mechanism 16. When a pattern portion 7a of the mold 7 is pressed against the imprint material 9 above the substrate 10, a position of the mold 7 and a position of the substrate 10 are aligned with each other by adjusting a position of the substrate stage 4. Actuators applicable to the substrate stage 4 include, for example, linear motors, servomotors, or air cylinders.

The substrate stage 4 may be configured so that the substrate 10 can be moved not only in the X-axis direction and the Y-axis direction but also in the Z-axis direction. The imprinting and the releasing of the mold 7 in the imprint apparatus 1 is implemented by moving the mold 7 in the Z-axis direction. Here, the imprinting and the releasing of the mold 7 may be implemented by moving the substrate 10 in the Z-axis direction. Furthermore, the imprinting and the releasing of the mold 7 may be realized by moving both of the mold 7 and the substrate 10 relatively in the Z-axis direction. In addition, the substrate stage 4 may be configured to have a tilt function for adjusting a position of the substrate 10 in an θ (rotation around the Z axis) direction and the inclination of the substrate 10.

The substrate stage 4 includes the plurality of reference mirrors 17 corresponding to each of X, Y, Z, ωx, ωy, and ωz directions on a side surface thereof. On the other hand, the imprint apparatus 1 includes a plurality of laser interferometers 18 configured to measure a position of the substrate stage 4 by irradiating each of the reference mirrors 17 with, for example a helium neon laser. In FIG. 1, as an example, only one set of the reference mirror 17 and the laser interferometer 18 is illustrated. The laser interferometer 18 measures a position of the substrate stage 4 in real time and the controller 6 which will be described later performs positioning control of the substrate 10 on the basis of a measurement value at this time. Furthermore, an encoder may be used for measuring a position of the substrate stage 4.

The coating unit (a supply unit) 5 disperses and applies, as droplets, the imprint material 9 above a pattern forming region of the substrate 10 in at least one pattern forming region arranged in the vicinity of the mold holding unit 3 and existing above the substrate 10. The coating and a coating position of the imprint material 9, an amount of the imprint material 9 to be applied, and the like are controlled on the basis of an operation command from the controller 6 which will be described later. In the first embodiment, the coating unit 5 may include a container 19 configured to have an inkjet method employed as a coating method and accumulate an uncured imprint material 9 and a discharge unit 20 configured to discharge the uncured imprint material 9 above the substrate 10. It is desirable that the imprint material 9 can be managed, for example, while the inside of the container 19 is set to have an atmosphere containing a small amount of oxygen so that a curing reaction of the imprint material 9 does not occur. Furthermore, a material of the container 19 in which particles and chemical impurities are prevented from being incorporated into the imprint material 9 is preferable. The discharge unit 20 has, for example, a piezo-type discharge mechanism (an injection head) having a plurality of discharge ports.

The controller 6 includes a CPU, a memory, and the like and is constituted of at least one computer. Furthermore, the controller 6 is connected to each constituent element of the imprint apparatus 1 via a circuit and controls an operation and an adjustment of each constituent element of the entire imprint apparatus 1 in accordance with a program stored in the memory. In addition, the controller 6 may be constituted integrally with other parts of the imprint apparatus 1 (in a common housing), may be formed separately from the other parts of the imprint apparatus 1 (in a different housing), or may be installed at a location different from that of the imprint apparatus 1 and controlled remotely.

The alignment measurement unit (a detection unit) 21 can measure (detect) a mark (an alignment mark on the mold side) formed on the mold 7 and a mark (an alignment mark on the substrate side) formed on the substrate 10. The imprint apparatus 1 can determine relative positions of the mold 7 and the substrate 10 on the basis of the detection results of the alignment measurement unit 21 and move either the mold 7 or the substrate 10 to align the mold 7 and the substrate 10.

As the imprint material 9, for example, a curable composition cured when energy for curing is applied thereto is utilized. Electromagnetic waves, heat, and the like are utilized as the energy for curing. The electromagnetic waves are, for example, light such as infrared rays, visible rays, and ultraviolet rays whose wavelength is selected from the range of 10 nm or more and 1 mm or less. In the first embodiment, a photocuring method for curing the imprint material 9 through irradiation with the irradiation light 8 such as ultraviolet rays will be adopted. A photocurable composition (a photocurable material) cured through light contains at least a polymerizable compound and a phtopolymerization initiator and may contain a non-polymerizable compound or a solvent as necessary. The non-polymerizable compound is at least one selected from the group of sensitizers, hydrogen donors, internal type release mould agents, surfactants, antioxidants, polymer components, and the like.

The imprint material 9 is applied in a film shape above the substrate 10 using, for example, a spin coater or a slit coater. Furthermore, the imprint material 9 may be applied above the substrate 10 in a droplet shape or an island shape or films formed by connecting a plurality of droplets through a liquid injection head of the discharge unit 20. In addition, with regard to the viscosity of the imprint material 9, for example, the viscosity at 25° C. is 1 mPa·s or more and 100 mPa·s or less.

To be specific, an amount of the imprint material 9 to be applied (discharged) may be adjusted such that it is in a range of 0.1 to 10 pL/drop and is usually approximately 1 pL/drop. A total amount of the imprint material 9 which is applied is determined using a density of the pattern portion 7a and a desired residual film thickness.

The mold 7 has a rectangular outer circumferential portion and has a mesa portion (a pattern region) 601 formed in a convex portion of several tens of μm to several hundreds of μm at a central portion of a surface (a pattern surface) facing the substrate 10. The mesa portion 601 has the pattern portion 7a in which a concave and convex pattern for transfer to the imprint material 9 supplied above the substrate 10 is formed in a three-dimensional shape. The concave and convex pattern is, for example, a concave and convex pattern to be transferred to the substrate 10 such as a circuit pattern. The mold 7 is made of a light-transmitting material through which the irradiation light 8 is transmitted, for example, quartz. Furthermore, the mold 7 may have a cavity having a circular planar shape and a certain depth on a surface irradiated with the irradiation light 8. Although the mold 7 includes the pattern portion 7a having a concave and convex pattern on the mesa portion 601 formed on a convex portion in the first embodiment, the pattern portion 7a is not limited thereto and may be a flat surface (a flat portion) in which a pattern is not formed on the mesa portion 601. In addition, the pattern portion 7a having a concave and convex pattern on the mesa portion 601 may be formed using a central portion of a surface (a pattern surface) facing the mold 7 as the mesa portion 601 formed as a concave portion.

Glass, ceramics, metals, imprint materials, or the like are used for the substrate 10, and as necessary, a member made of a material different from that of the substrate 10 may be formed on the surface thereof. Furthermore, specifically, the substrate 10 is a silicon wafer, a compound semiconductor wafer, a glass wafer containing quartz as a material, or the like. In addition, the substrate 10 may be a glass substrate for manufacturing a replica mask from a master mask through imprint processing.

An example of general imprint processing steps in which the imprint apparatus 1 is utilized will be described below. The imprint processing is performed using the controller 6. First, the controller 6 places and fixes the substrate 10 on the substrate stage 4 using the substrate transfer portion. Subsequently, the controller 6 causes the stage driving mechanism 16 to be driven, causes an alignment mark above the substrate 10 to be sequentially measured using the alignment measurement unit 21 while appropriately changing a position of the substrate 10, and detects the position of the substrate 10 with high accuracy. Furthermore, the controller 6 calculates the coordinates for transferring a pattern from the detection result. Subsequently, the controller 6 causes the stage driving mechanism 16 to drive and causes a prescribed coating position above the substrate 10 (a specific position above the pattern forming region) to move below the discharge ports of the discharge unit 20. Subsequently, the controller 6 controls the coating unit 5 such that a prescribed coating position above the substrate 10 is coated with the imprint material 9 (a coating step).

Subsequently, the controller 6 causes the substrate 10 to move and to be positioned using the stage driving mechanism 16 so that the pattern forming region is located at a pressing position directly below the pattern portion 7a of the mold 7. Subsequently, the controller 6 performs the alignment between the pattern portion 7a and a substrate-side pattern above the pattern forming region, magnification correction of the pattern portion 7a using a magnification correction mechanism, and the like and then causes the mold moving mechanism 12 to drive. When the pattern portion 7a is pressed against the imprint material 9 above the pattern forming region, the pattern portion 7a is deformed into a convex shape toward the substrate 10 and pressed against the imprint material 9 (an imprinting step). Furthermore, at this time, the alignment measurement unit 21 measures a relative positional relationship of the alignment marks provided on the mold 7 and the substrate 10 and aligns the mold 7 and the substrate 10 (an alignment step). Through this pressing, the concave and convex pattern of the pattern portion 7a is filled with the imprint material 9. The controller 6 determines the completion of the imprint step using, for example, a load sensor (not shown) installed inside the mold holding unit 3. In this state (a state in which the pattern portion 7a of the mold 7 is in contact with the imprint material 9), the irradiation unit 2 performs irradiation of the irradiation light 8 from a back surface (upper surface) of the mold 7 for a prescribed time and cures the imprint material 9 using the irradiation light 8 transmitted through the mold 7 (a curing step). At the time of curing, a photocurable composition such as the imprint material 9 may not be cured due to oxygen inhibition in the presence of oxygen. Thus, it is desirable to perform irradiation of light in an atmosphere such as helium, carbon dioxide, or nitrogen. Furthermore, after the imprint material 9 has been cured, the controller 6 causes the mold moving mechanism 12 to drive again and causes the pattern portion 7a to be pulled away from the substrate 10 (a releasing step). Thus, a three-dimensional pattern (layer) which follows the concave and convex pattern of the pattern portion 7a is formed on a surface of the pattern forming region above the substrate 10 (a pattern forming step).

When an operation of a series of processes such as the coating step, the imprinting step, the alignment step, the curing step, and the releasing step as described above is performed a plurality of times while changing the pattern forming region through the driving of the substrate stage 4, the imprint apparatus 1 can form a pattern of a plurality of pieces of imprint material 9 above one substrate 10. The series of processes such as the pressurizing step, the alignment step, the curing step, and the releasing step described above is referred to as "imprint processing". Furthermore, for example, the above series of steps including the coating step may also be referred to as "imprint processing" in some cases.

Figure 2A:
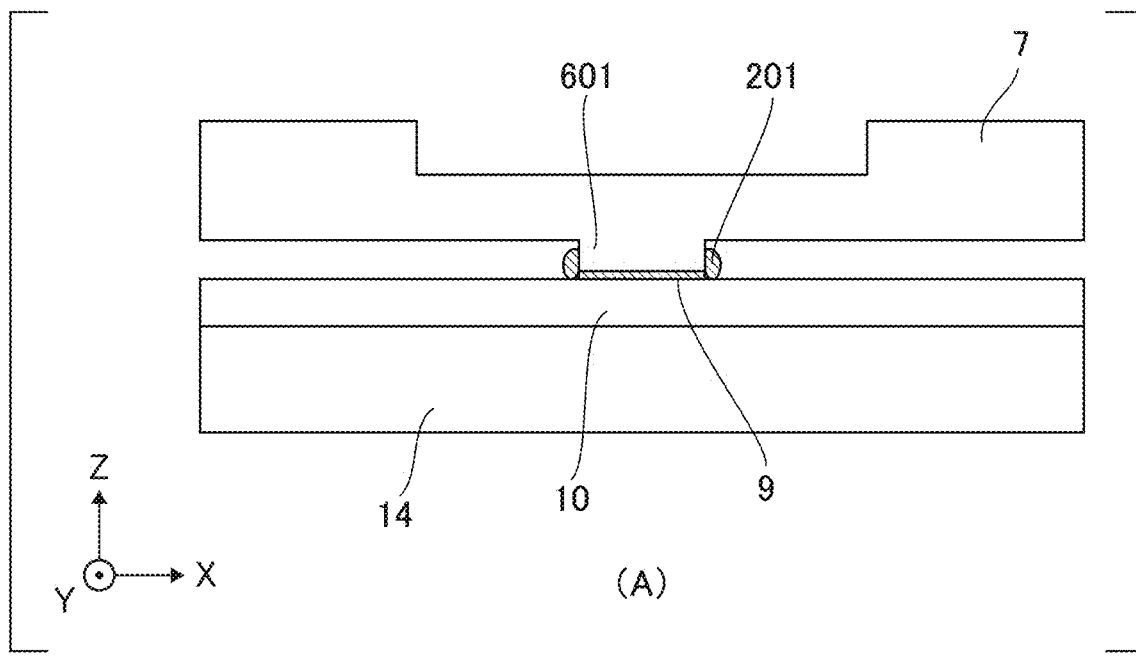
FIGS. 2A and 2B are diagrams of a form in which an uncured imprint material protrudes.
Figure 2B:
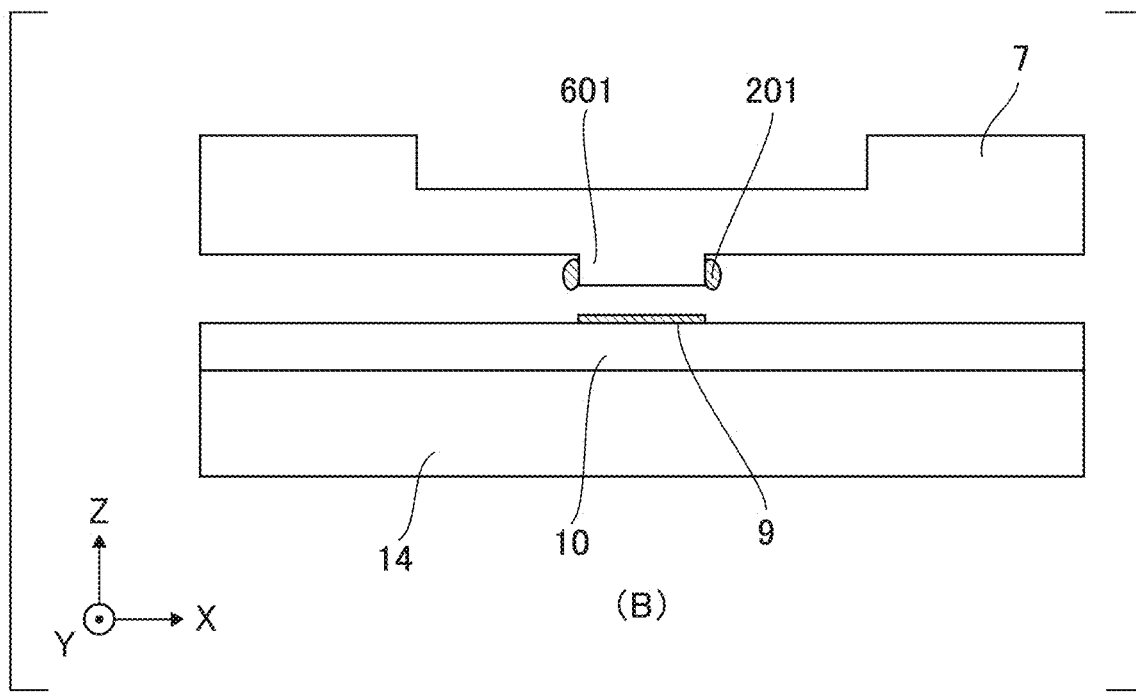

The protrusion of the uncured imprint material (uncured material) 9 in the mesa portion 601 of the mold 7 will be described below with reference to FIGS. 2A and 2B. FIGS. 2A and 2B are diagrams illustrating an example of a form in which the uncured imprint material 9 protrudes. FIG. 2A illustrates a state in which the mold 7 is pressed against the imprint material 9 above the substrate 10 held in the substrate chuck 14. FIG. 2B illustrates a state in which the mold 7 is released from the substrate 10. As illustrated in FIG. 2A, the imprint material 9 immediately after the imprinting protrudes from the mesa portion 601 of the mold 7. Here, the imprint material 9 is an uncured imprint material applied above the substrate 10 and an imprint material 201 is an uncured imprint material which protrudes from the mesa portion 601 during the above-described imprinting step. For this reason, the imprint material 9 and the imprint material 201 are the same imprint material.

In this state (a state in which the uncured imprint material 9 protrudes from the mesa portion 601), the imprint material 9 is irradiated with the irradiation light 8 transmitted through the mold 7. However, with regard to the uncured imprint material 201, if a portion other than the pattern portion 7a of the mold 7 is irradiated with light such as ultraviolet rays, a non-pattern-formation region (not shown) above the substrate 10 is adversely affected. For this reason, normally, an irradiation range is controlled by the controller 6 so that a portion other than the pattern portion 7a is not irradiated with light. That is to say, the imprint material 201 is not cured through the irradiation of the irradiation light 8 in the curing step.

Since the imprint material 201 is not irradiated with the irradiation light 8, after the mold is released, the imprint material 201 with an uncured state remains in a peripheral region, for example, an outer circumferential region (an outer circumferential portion) of the mesa portion 601 of the mold 7. The imprint material 201 remaining in this mesa portion 601 accumulates or falls as a drop due to the accumulation and contaminates the inside of the apparatus. Furthermore, the volatile components from the imprint material 201 evaporate to be foreign matters, which contaminate the inside of the apparatus. For this reason, the imprint material 201 protruding from the mesa portion 601 can be a cause (a source of pollution) of contamination in the apparatus such as an imprint apparatus.

Figures 3A, 3B:
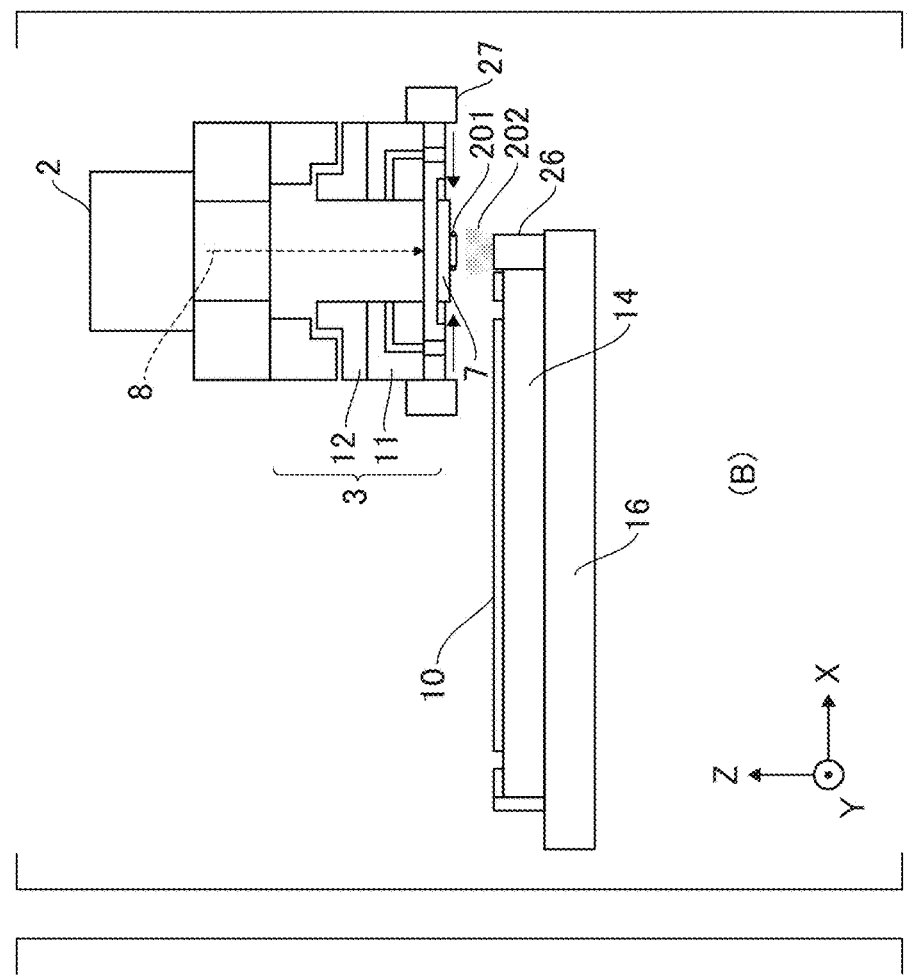
FIGS. 3A and 3B are diagrams illustrating an example of an operation method of the imprint apparatus according to the first embodiment.

Thus, the imprint apparatus 1 in the first embodiment includes the irradiation unit 26 which is a light source different from the light source configured to cure the imprint material 9 and irradiates the uncured imprint material 201 protruding from the mesa portion 601 with an irradiation light 202 and curing the uncured imprint material 201. The imprint apparatus 1 according to the first embodiment will be described below with reference to FIGS. 3A and 3B. FIGS. 3A and 3B are diagrams illustrating an example of an operation of the imprint apparatus 1 according to the first embodiment. FIG. 3A illustrates a state in which the stage driving mechanism 16 moves so that the irradiation unit 26 is located directly below the mesa portion 601 in the state at the time of processing when the imprint material 9 protrudes. FIG. 3B illustrates a form in which the irradiation of the irradiation light 8 is performed from the irradiation unit 26 in a state after the stage driving mechanism 16 has moved. The description of the same configuration as that of the imprint apparatus 1 illustrated in FIG. 1 will be omitted.

The irradiation unit (a second irradiation unit) 26 is disposed (installed) on the substrate stage 4 and irradiates the peripheral region including the outer circumferential portion of the mesa portion 601 having the pattern portion 7a of the mold 7 with the irradiation light 202. The irradiation unit 26 is disposed on either the substrate chuck 14 or the stage driving mechanism 16. Furthermore, the irradiation unit 26 may be disposed on both of the substrate chuck 14 and the stage driving mechanism 16. When the irradiation unit 26 is disposed on the substrate chuck 14, the irradiation unit 26 is disposed on a side surface of the outer circumferential region of the substrate chuck 14. When the irradiation unit 26 is disposed on the stage driving mechanism 16, the irradiation unit 26 is disposed on the upper surface of the stage driving mechanism 16 of the outer circumferential region of the substrate chuck 14. The irradiation light 202 radiated from the irradiation unit 26 may include light having a wavelength in which the imprint material 201 is cured. Furthermore, although the irradiation unit 26 is disposed on the stage driving mechanism 16 in the first embodiment, the present invention is not limited thereto. In addition, the irradiation unit 26 may be disposed on the substrate chuck 14. The illumination conditions of the irradiation unit 26 may be any conditions as long as the imprint material 9 and the imprint material 201 are cured under the conditions. Here, the illumination conditions are determined in consideration of the material properties of the imprint material 201 and the like. The illumination conditions include, for example, information such as a wavelength of light to be radiated, an amount (an amount of irradiation) of the irradiation light 202 to be radiated from the irradiation unit 26, an intensity of the irradiation light 202, and an irradiation time. In addition, the irradiation order of each pattern forming region, a movement path of the substrate 10 between the pattern forming regions, and the like may be included. The irradiation light 202 of the irradiation unit 26 may have a truncated cone shape in which an irradiation surface expands as the irradiation light 202 is parallel light or moves forward or have a beam shape which has the spread in the X-axis and Y-axis directions. In addition, when the irradiation of the irradiation light 202 is performed, the controller 6 may cause the irradiation to be performed with a constant light intensity, may the intensity of light to gradually increase from the start of irradiation or may control irradiation with a specific periodicity.

For the irradiation unit 26, for example, an LED, a laser diode (LD), a halogen lamp, an excimer lamp, a cold cathode fluorescent lamp, a HID lamp, or the like may be used and other light sources may be used and the present invention is not limited thereto. In the first embodiment, the irradiation unit 26 is installed in the stage driving mechanism 16 and moved. Thus, it is desirable to utilize a small and lightweight LED or LD.

The irradiation unit 26 can irradiate the imprint material 201 accumulated in the peripheral region of the mesa portion 601 having the pattern portion 7a of the mold 7 within the range in which the stage driving mechanism 16 can move with the irradiation light 202 and cure the imprint material 201. A timing at which the imprint material 201 is cured is controlled by the controller 6 and may be set each pattern forming region after the imprint processing of the substrate 10, when the mold 7 is unload, and the like. Furthermore, the timing is not limited to these timings, the imprint material 201 may be cured in accordance with various imprint processing situations. The number of irradiation units 26 is not limited to one and a plurality of irradiation units 26 may be disposed. Furthermore, the irradiation unit 26 disposed in the stage driving mechanism 16 may be able to perform irradiation on the mold 7 while scanning. In that case, the illumination conditions may further include, for example, a scanning direction and a scanning speed at the time of performing the irradiation of the irradiation light 202 while scanning the pattern forming region.

Also, a distal end of the discharge unit 20 configured to discharge the imprint material 9 is filled with the uncured imprint material 9. If the discharge unit 20 is irradiated with the irradiation light 202, the imprint material 9 at the distal end portion of the discharge unit 20 may be cured, resulting in non-discharge. For this reason, the controller 6 performs control so that the discharge unit 20 is not irradiated when the imprint material 201 is irradiated with the irradiation light 202 from the irradiation unit 26. Furthermore, it is desirable to install the irradiation unit 26 at a position in which the irradiation unit 26 is sufficiently distant from the discharge unit 20 and to provide a light shielding unit so that the discharge unit 20 is not irradiated with the irradiation light 202.

Figure 4:
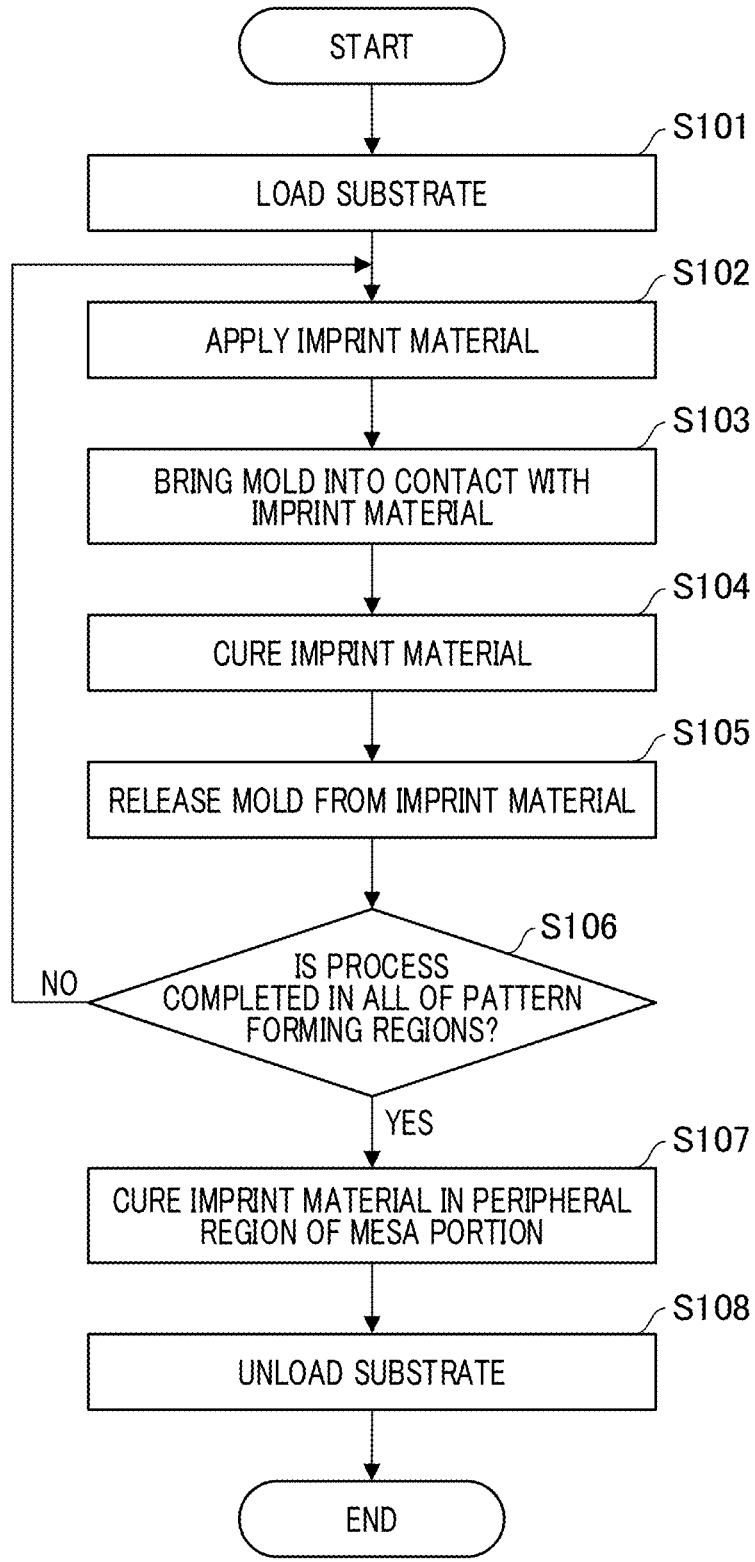
FIG. 4 is a flowchart for describing an operation sequence of the imprint apparatus according to the first embodiment.

The imprint processing step in which the imprint apparatus 1 in the first embodiment is utilized will be described below with reference to FIG. 4. FIG. 4 is a flowchart for describing an example of an operation sequence of the imprint processing in the first embodiment. Each operation (step) illustrated in association with the flowchart of FIG. 4 is controlled through a computer program executed using the controller 6.

First, in Step S101, the controller 6 loads the substrate 10 into the imprint apparatus 1. The substrate 10 is load into the substrate chuck 14 in a substrate transport mechanism (not shown). Subsequently, in Step S102, the controller 6 controls the discharge unit 20 to supply the imprint material 9 to a prescribed pattern forming region above the substrate 10 having the pattern of the imprint material 9 formed thereon. Subsequently, in Step S103, the controller 6 brings the mold 7 and the substrate 10 close to each other to bring the imprint material 9 supplied onto the substrate 10 into contact (imprint) with the pattern portion 7a of the mold 7. Subsequently, in Step S104, after the pattern portion 7a is filled with the imprint material 9, the controller 6 performs the alignment between the mold 7 and the substrate 10 in a state in which the mold 7 is in contact with the imprint material 9. For the alignment, for example, the alignment measurement unit 21 detects the light from the alignment mark on the mold 7 side and the alignment mark on the substrate 10 side to perform the alignment between the mold 7 and the substrate 10. After the alignment, the irradiation unit 2 irradiates the imprint material 9 above the substrate 10 with the irradiation light 8 for a prescribed time to cure the imprint material 9.

Subsequently, in Step S105, the controller 6 causes the mold moving mechanism 12 to drive again and causes the pattern portion 7a to be pulled away from the substrate 10. Subsequently, in Step S106, the controller 6 determines whether the process of Steps S102 to S105 are completed in all of the pattern forming regions. If the process of Steps S102 to S105 are completed in all of the pattern forming regions, the process proceeds to Step S107. If the process of Steps S102 to S105 is not completed in all of the pattern forming regions, the process returns to Step S102 and the process of Steps S102 to S105 is performed. This process is repeatedly performed until the process is completed in all the pattern forming regions.

Subsequently, in Step S107, after the irradiation by the irradiation unit 2, the controller 6 causes the irradiation unit 26 to irradiate the peripheral region of the mesa portion 601 having the pattern portion 7a of the mold 7 which is a region different from an irradiated region of the irradiation unit 2 with the irradiation light 202. Through this irradiation, the imprint material 201 remaining (adhering) in an uncured state is cured. At this time, the irradiation unit 26 may irradiate the peripheral region of the mesa portion 601 with the irradiation light 202 while scanning (moving). Subsequently, in Step S108, the controller 6 causes the substrate transport mechanism (not shown) to drive and causes the substrate 10 to unload from the substrate chuck 14.

The irradiation of the imprint material 9 with the irradiation light 8 using the irradiation unit 2 in Step S104 and the irradiation of the imprint material 201 with the irradiation light 202 using the irradiation unit 26 in Step S107 may be performed in conjunction with each other.

As described above, according to the first embodiment, the irradiation light 202 is less likely to diffuse or leak to the other side and can directly irradiate the imprint material 201 protruding from the mesa portion 601 directly below the mold 7 with the irradiation light 202 from the irradiation unit 26 and curing the imprint material 201. For this reason, contamination inside the apparatus due to the protruding imprint material can be minimized.

Second Embodiment

Figure 5A:
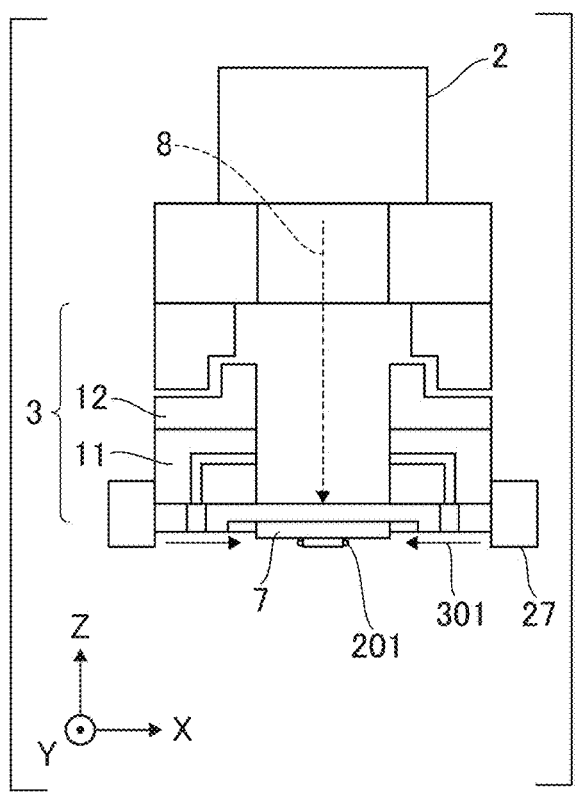
FIGS. 5A and 5B are diagrams illustrating an example of a configuration of an imprint apparatus according to a second embodiment.
Figure 5B:
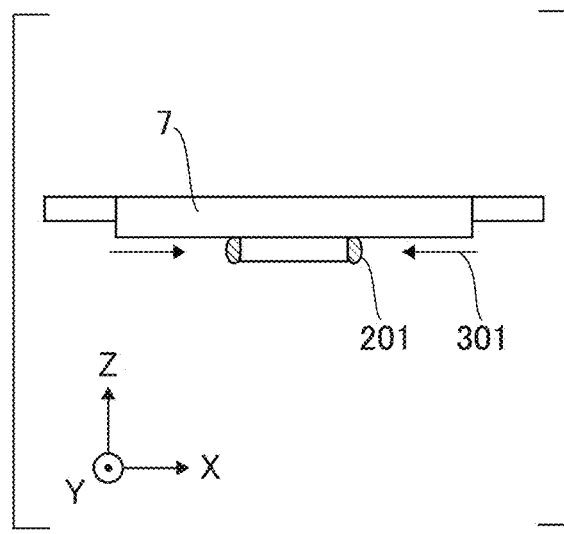

In an imprint apparatus 1 in a second embodiment, an irradiation unit 27 which is a light source configured to cure an uncured imprint material 201 protruding from a mesa portion 601 is installed at a location different from that of the first embodiment. The imprint apparatus 1 according to the second embodiment will be described below with reference to FIGS. 5A and 5B. FIGS. 5A and 5B are schematic diagrams illustrating an example of a configuration of the imprint apparatus 1 in the second embodiment. FIG. 5A illustrates a schematic diagram of the imprint apparatus 1 in a state in which the irradiation of an irradiation light 301 is performed from the irradiation unit 27. FIG. 5B illustrates a form in which the uncured imprint material 201 is irradiated with the irradiation light 301. The description of the same configuration as that of the imprint apparatus 1 illustrated in FIG. 1 will be omitted.

The irradiation unit (a second irradiation unit) 27 is disposed (installed) on a mold holding unit 3 and irradiates a peripheral region including an outer circumferential portion of a mesa portion 601 having a pattern portion 7a of a mold 7 with an irradiation light 202. To be specifically, the irradiation unit 27 is disposed in an outer circumferential portion of a mold chuck 11 included in the mold holding unit 3 and performs the irradiation of the irradiation light 301 so that a peripheral region of the mesa portion 601 can be irradiated with an irradiation light 301. An irradiation port configured to radiate the irradiation light 202 of the irradiation unit 27 is provided near, for example, a protruding portion downward (in a-Z-axis direction) from a lower surface of the mold holding unit 3. The irradiation light 301 radiated from the irradiation unit 27 may include light having a wavelength in which the imprint material 201 is cured. Since the irradiation unit 27 is provided in the mold holding unit 3, the peripheral region including the outer circumferential portion of the mesa portion 601 is irradiated with the parallel irradiation light 301 from a side surface direction. The illumination conditions of the irradiation unit 27 are the same as those in the first embodiment. Although the irradiation light 301 of the irradiation unit 27 is preferably parallel light, the irradiation light 301 may have a truncated cone shape or a beam shape having a spread in the X and Y directions as long as it does not diffuse or leak to the other side. Furthermore, the irradiation unit 27 may include light having a wavelength in which the imprint material 201 is cured. As the light source, for example, an LED, a LD, a halogen lamp, an excimer lamp, a cold cathode tube, a HID, or the like may be utilized and other light sources may be utilized without limitation. In the second embodiment, since the irradiation unit 27 is installed on the mold holding unit 3 and moved, it is desirable to utilize a small and lightweight LED or LD.

The irradiation unit 27 can irradiate the imprint material 201 accumulated on the peripheral region of the mesa portion 601 of the mold 7 with the irradiation light 301 and cure the imprint material 201. A timing at which the imprint material 201 is cured is controlled by the controller 6 and may be set for each pattern forming region after the imprinting process on the substrate 10, when the mold 7 is unload, and the like. Furthermore, the timing is not limited to these timings and curing may be performed in accordance with various imprint processing conditions. The number of irradiation units 27 is not limited to one and a plurality of irradiation units 27 may be disposed. Furthermore, a drive mechanism in which a height can be adjusted in the Z-axis direction is further provided in the mold holding unit 3 and the irradiation unit 27 may be installed in the drive mechanism. Thus, the height in the Z-axis direction can be controlled and the irradiation range or the position of the irradiation unit 27 can be adjusted in accordance with an adhesion position of the imprint material 201. In addition, the irradiation unit 27 may be provided in both of the mold holding unit 3 and the stage driving mechanism 16.

Also, a flow of imprint processing in which the imprint apparatus 1 in the second embodiment is used is the same as the flow of the imprint processing illustrated in FIG. 4 in the first embodiment except that, in the process of Step S107, the imprint material 201 is cured using the irradiation light 301 of the irradiation unit 27. For this reason, description thereof will be omitted.

As described above, according to the second embodiment, the irradiation light 301 is less likely to diffuse or leak to the other side and the imprint material 201 can be cured by directly irradiating the imprint material 201 protruding from the mesa portion 601 with the irradiation light 301 from the irradiation unit 27 from a side surface. For this reason, contamination inside the apparatus due to the protruding imprint material can be minimized.

Third Embodiment

Figure 6:
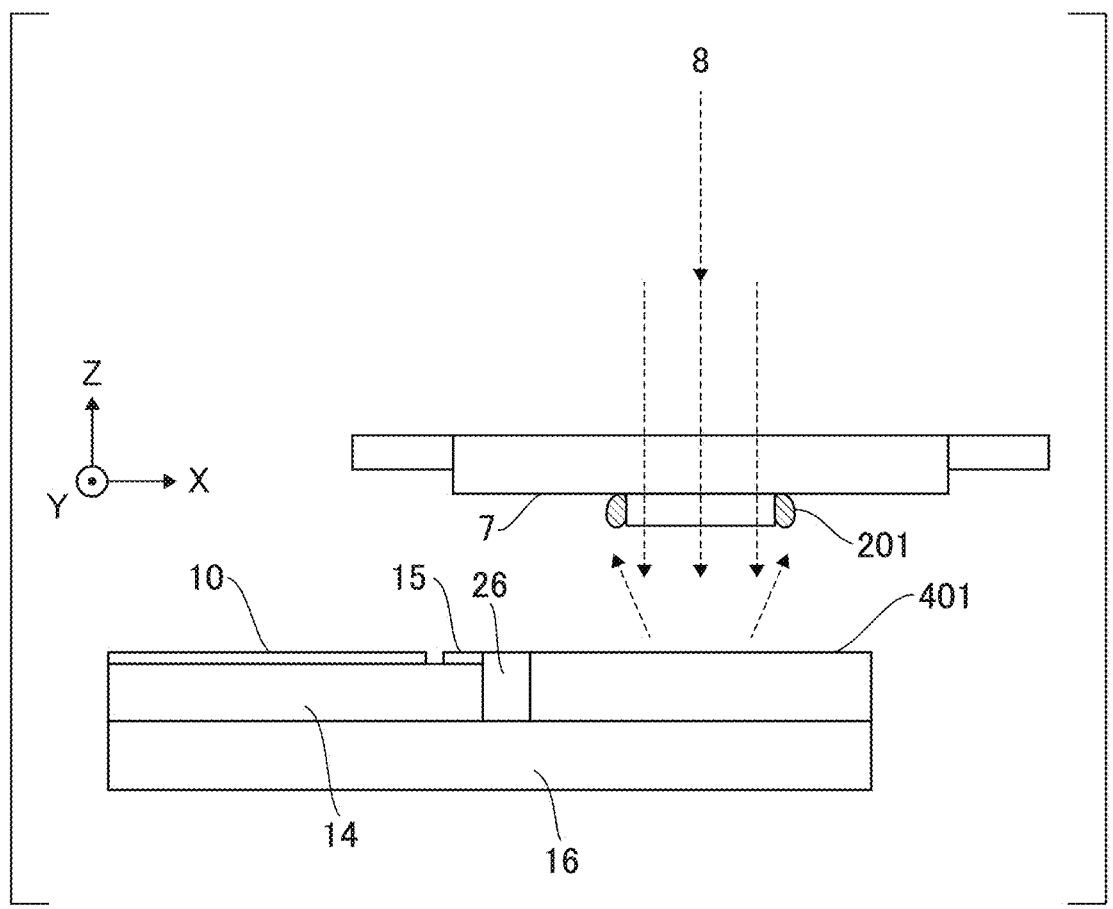
FIG. 6 is a diagram illustrating an example of a configuration of an imprint apparatus according to a third embodiment.

In the imprint apparatus 1 in the third embodiment, a reflection unit 401 configured to reflect the irradiation light 8 from the irradiation unit 2 is disposed on the stage driving mechanism 16. The imprint apparatus 1 according to the third embodiment will be described below with reference to FIG. 6. FIG. 6 is a schematic diagram illustrating an example of a configuration of the imprint apparatus 1 in the third embodiment. The description of the same configuration as that of the imprint apparatus 1 illustrated in FIG. 1 will be omitted.

The reflection unit 401 includes a reflection mirror on an upper surface of the reflection unit 401 and can reflect the irradiation light 8 to the peripheral region of the mesa portion 601 having the pattern portion 7a by irradiating the reflection mirror with the irradiation light 8 radiated from the irradiation unit 2. Furthermore, the imprint material 201 protruding due to the reflected light is irradiated and cured. In the third embodiment, the reflection mirror has a planar shape. To be specifically, the reflection unit 401 is disposed on an upper surface of the stage driving mechanism 16 in the outer circumferential region of the substrate chuck 14. Furthermore, the imprint apparatus 1 in the third embodiment may include either the irradiation unit 26 or the irradiation unit 27, and when the irradiation unit 26 is included, the reflection unit 401 is disposed on the upper surface of the stage driving mechanism 16 in the outer circumferential region. In addition, the reflection mirror may be disposed on an upper surface of the irradiation unit 26 and serve as the reflection unit 401. Moreover, although the reflection unit 401 is formed of glass, ceramics, a metal, or the like, as necessary, a member made of a material different from that of the substrate 10 may be formed on a surface thereof. A difference between heights of the upper surface of the reflection unit 401 and the upper surface of the substrate 10 held by the substrate chuck 14 may be 1 mm or less. More preferably, the difference between the heights of the upper surface of the reflection unit 401 and the upper surface of the substrate 10 held in the substrate chuck 14 may be 0.1 mm or less.

If the reflected light from the reflection mirror of the upper surface of the reflection unit 401 hits the distal end of the discharge unit 20 configured to discharge the imprint material 9 in an uncured state, an adverse effect is provided. For this reason, a mirror having a concave surface shape may be used or a shape having a combination of a planar shape and a concave surface shape may be used so that the reflected light does not hit, for example, so that the reflected light does not diffuse to the outside and the like of the mold 7. Furthermore, a convex surface mirror may be used as long as the reflected light does not diffuse outside the mold 7 or the distal end of the discharge unit 20 is not radiated.

A timing at which the imprint material 201 is cured using the reflection unit 401 is controlled by the controller 6 and may be for each pattern forming region after the imprinting process on the substrate 10, when the mold 7 is unloaded, and the like. In addition, the timing is not limited to these timings and curing may be performed in accordance with various imprint processing situations. The number of reflection units 401 is not limited to one and a plurality of reflection units 401 are disposed.

Also, a flow of imprint processing in which the imprint apparatus 1 in the third embodiment is utilized is the same as the flow of the imprint processing of FIG. 4 illustrated in the first embodiment except that, in the process of Step S107, the imprint material 201 is cured using the reflected light from the reflection unit 401.

As described above, according to the third embodiment, the uncured imprint material 201 protruding from the mesa portion 601 can be directly irradiated with the reflected light obtained by reflecting the irradiation light 8 radiated to the reflection unit 401 and cured. Therefore, even if the irradiation unit 26 and the irradiation unit 27 are not disposed, the imprint material 201 can be cured and contamination inside the apparatus due to the protruding imprint material can be minimized.

Fourth Embodiment

Figure 7:
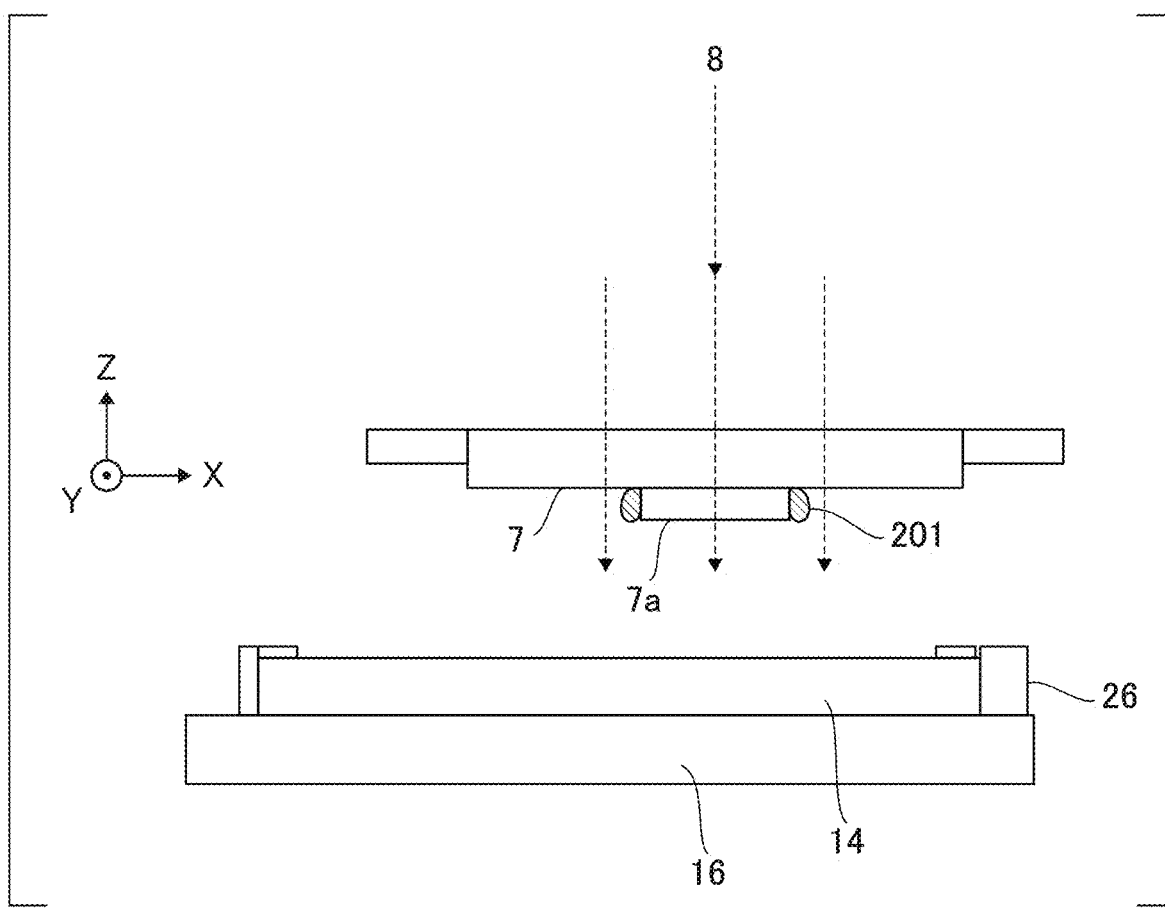
FIG. 7 is a diagram illustrating an example of a configuration of an imprint apparatus according to a fourth embodiment.

An imprint apparatus 1 in a fourth embodiment cures a protruding imprint material 201 of a mold 7 using a light shielding unit configured to change an irradiated region of an irradiation light 8. The imprint apparatus 1 according to the fourth embodiment will be described below with reference to FIG. 7. FIG. 7 is a schematic diagram illustrating an example of a configuration of the imprint apparatus 1 in the fourth embodiment. The description of the same configuration as that of the imprint apparatus 1 illustrated in FIG. 1 will be omitted.

A light shielding unit (an exposure blade) is a light-shielding plate configured to limit the irradiation range of the irradiation light 8 emitted from the irradiation unit 2 onto the substrate 10, is located between the mold 7 and the irradiation unit 2, and can arbitrary change (adjust) the irradiation range of the irradiation light 8. At the time of irradiation, an irradiated region determined at a position of a light shielding member is irradiated with the irradiation light 8 from the irradiation unit 2. The position of the light shielding unit is controlled by the controller 6 so that only the peripheral region of the mesa portion 601 having the pattern portion 7a in the irradiated region of the irradiation light 8 is irradiated. Furthermore, the imprint apparatus 1 in the fourth embodiment may include at least one or more of the irradiation unit 26, the irradiation unit 27, and the reflection unit 401.

If a portion other than the pattern portion 7a of the mold 7 is irradiated with the irradiation light 8, the irradiation light 8 may adversely affect the non-pattern-formation region (not shown) above the substrate 10. For this reason, it is desirable that the timing at which the peripheral region of the mesa portion 601 is radiated be set in a state in which the substrate 10 is not directly below the mold 7. For example, the timing may be set when the substrate 10 is not located directly below the mold 7 after the substrate 10 undergoes the imprint processing and when the mold 7 is unloaded.

Also, with regard to a flow of imprint processing in which the imprint apparatus 1 in the fourth embodiment is utilized, the process of Step S107 is performed to change the irradiation range using the light shielding unit. After that, the flow of the imprint process of FIG. 4 illustrated in the fourth embodiment is the same as the flow of the imprint processing of FIG. 4 illustrated in the first embodiment except that the imprint material 201 is irradiated with the irradiation light 8 from the irradiation unit 2 and cured. For this reason, description thereof will be omitted.

As described above, according to the fourth embodiment, the uncured imprint material 201 protruding from the mesa portion 601 can be cured by controlling the light shielding unit to adjust the irradiation range of the irradiation light 8. Therefore, even if the irradiation unit 26 and the irradiation unit 27 are not disposed, the imprint material 201 can be cured and contamination inside the apparatus due to the protruding imprint material can be minimized.

Embodiment of Article Manufacturing Method

A pattern of a cured product formed using the imprint apparatus 1 is used permanently for at least a part of various articles or temporarily at the time of manufacturing various articles. The article is an electric circuit element, an optical element, a MEMS, a recording element, a sensor, a mold, or the like. Examples of the electric circuit element include volatile or non-volatile semiconductor memories such as DRAMs, SRAMs, flash memories, and MRAMs, semiconductor elements such as LSIs, CCDs, image sensors, and FPGAs. Examples of the mold include a mold for imprinting.

The pattern of the cured product is used as it is as a constituent member of at least a part of the above article or is temporarily used as a resist mark. The resist mask is removed after etching or ion implantation in the substrate processing is processed.

Figure 8A:
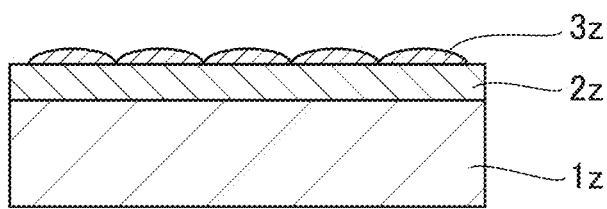
FIGS. 8A to 8F is a schematic diagram for explaining an article manufacturing method.

A specific manufacturing method of an article will be described below with reference to FIGS. 8A to 8F. As illustrated in FIG. 8A, a substrate 1z such as a silicon wafer having a material to be processed 2z such as an insulator molded on a surface thereof is prepared and then an imprint material (a photocurable material) 3z is applied to the surface of the material to be processed 2z through an inkjet method or the like. Here, a form in which a plurality of droplet-shaped imprint materials 3z are applied onto the substrate is illustrated.

Figure 8B:
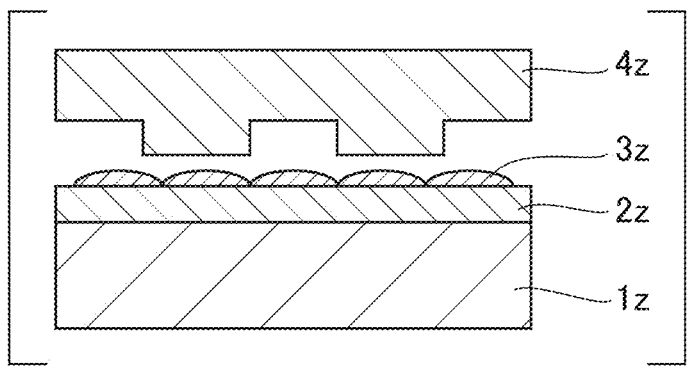
Figure 8C:
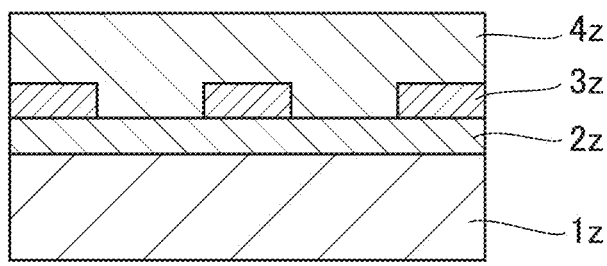

As illustrated in FIG. 8B, a side of an imprint mold 4z on which a concave and convex pattern is molded faces the imprint material 3z above the substrate to face each other. As illustrated in FIG. 8C, the substrate 1z to which the imprint material 3z is applied is brought into contact with a mold 4z and undergoes pressure (a contact step). A gap between the mold 4z and the material to be processed 2z is filled with the imprint material 3z. In this state, if the imprint material 3z is irradiated with light as energy for curing to pass through the mold 4z, the imprint material 3z is cured (a curing step).

Figure 8D:
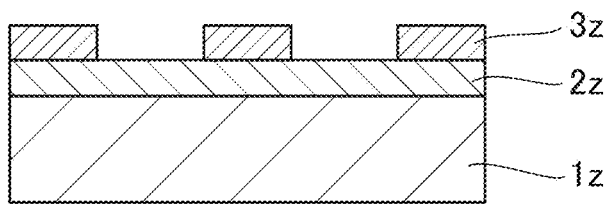

As illustrated in FIG. 8D, if the mold 4z and the substrate 1z are pulled away after the imprint material 3z is cured, the pattern of the cured product of the imprint material 3z is formed above the substrate 1z (a pattern forming step). The pattern of the cured product has a shape in which a concave portion of the mold corresponds to a convex portion of the cured portion and concave portion of the mold corresponds to the convex portion of the cured product, that is, the concave and convex pattern of the mold 4z is transferred to the imprint material 3z.

Figure 8E:
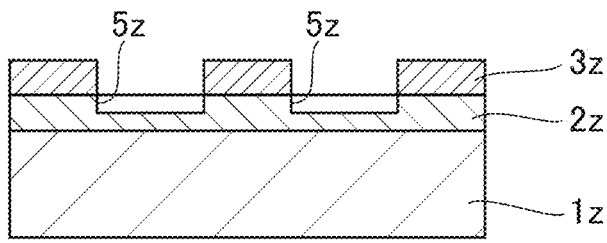
Figure 8F:
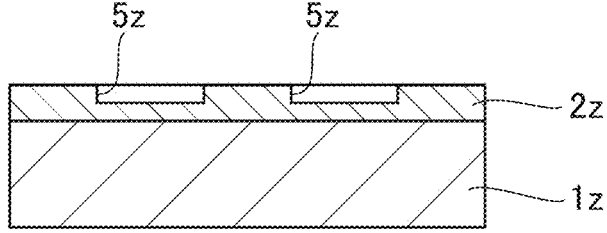

As illustrated in FIG. 8E, if etching is performed using the pattern of the cured product as an etching resist mask, a portion of the surface of the material to be processed 2z in which there is no cured product or remains thin is removed to form a groove 5z (a processing step). As illustrated in FIG. 8F, if the pattern of the cured product is removed, an article in which the groove 5z is formed in the surface of the material to be processed 2z can be obtained. Here, although the pattern of the cured product is removed, the pattern may be used as, for example, a film for interlayer insulation contained in a semiconductor element or the like, that is, as a constituent member of an article without being removed even after processing.

Also, a computer program which realizes a part or all of the control in the above-described embodiments may be supplied to the imprint apparatus 1 or the like over a network or various storage media. Furthermore, a computer (or a CPU, an MPU, or the like) in the imprint apparatus 1 or the like may read and execute the program. In this case, the program and the storage medium which stores the program constitute the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-068331, filed Apr. 6, 2020, which is hereby incorporated by reference wherein in its entirety.

What is claimed is:

1. An imprint method, comprising:
   a first irradiation step of irradiating, using a first irradiation unit, an imprint material on a substrate with light for performing curing in a state in which the imprint material is brought into contact with a pattern portion having a concave and convex pattern and being formed in a first surface of a mold that faces the imprint material in the state in which the imprint material is brought into contact with the pattern portion; and
   a second irradiation step of irradiating a peripheral region of the pattern portion of the mold with light after the irradiation of the light using the first irradiation unit, the peripheral region of the pattern portion of the mold being formed in a second surface of the mold different from the first surface of the mold that faces the imprint material in the state in which the imprint material is brought into contact with the pattern portion.

2. The imprint method according to claim 1, wherein, in the second irradiation step, a second irradiation unit included in a holder configured to hold the mold irradiates the peripheral region of the pattern portion of the mold formed in the second surface with the light.

3. The imprint method according to claim 1, wherein, in the second irradiation step, a second irradiation unit included in a substrate moving portion configured to hold and move the substrate irradiates the peripheral region of the pattern portion of the mold formed in the second surface with the light.

4. The imprint method according to claim 3, wherein, in the second irradiation step, irradiation of the peripheral region of the pattern portion of the mold formed in the second surface is performed while the substrate moving portion is moving.

5. The imprint method according to claim 1, wherein irradiation of the light in the first irradiation step and irradiation of the light in the second irradiation step are performed in conjunction with each other.

6. The imprint method according to claim 1, wherein, in the first irradiation step, a limitation is provided so that the peripheral region of the pattern portion of the mold formed in the second surface is not irradiated with the light.

7. The imprint method according to claim 1, wherein, in the second irradiation step, the peripheral region of the pattern portion of the mold formed in the second surface is irradiated with reflected light.

8. The imprint method according to claim 1, wherein, in the second irradiation step, a region that was irradiated with the light in the first irradiation step is not irradiated.

9. An article manufacturing method performed, at least in part, using an imprint apparatus which includes: a first irradiation unit configured to irradiate an imprint material on a substrate with light for performing curing in a state in which the imprint material is brought into contact with a pattern portion having a concave and convex pattern and being formed in a first surface of a mold that faces the imprint material in the state in which the imprint material is brought into contact with the pattern portion; and a second irradiation unit configured to irradiate a peripheral region of the pattern portion of the mold with light after the irradiation of the light using the first irradiation unit is utilized, the peripheral region of the pattern portion of the mold being formed in a second surface of the mold different from the first surface of the mold that faces the imprint material in the state in which the imprint material is brought into contact with the pattern portion, the method comprising:
   a pattern forming step of forming a pattern on the substrate;
   a processing step of processing the substrate after forming the pattern in the pattern forming step; and
   a step of manufacturing an article from the substrate processed in the processing step.

* * * * *